(12) United States Patent
Stecker et al.

(10) Patent No.: US 9,174,300 B2
(45) Date of Patent: Nov. 3, 2015

(54) RASTER METHODOLOGY, APPARATUS AND SYSTEM FOR ELECTRON BEAM LAYER MANUFACTURING USING CLOSED LOOP CONTROL

(71) Applicant: SCIAKY, INC., Chicago, IL (US)

(72) Inventors: Scott Stecker, Willow Springs, IL (US); Phillip E. Wollenhaupt, Crown Point, IN (US)

(73) Assignee: SCIAKY, INC., Chicago, IL (US)

( * ) Notice: Subject to any disclaimer, the term of this patent is extended or adjusted under 35 U.S.C. 154(b) by 292 days.

(21) Appl. No.: 13/891,303

(22) Filed: May 10, 2013

(65) Prior Publication Data

US 2014/0158667 A1 Jun. 12, 2014

Related U.S. Application Data

(63) Continuation of application No. 13/029,306, filed on Feb. 17, 2011, now Pat. No. 8,461,474.

(60) Provisional application No. 61/319,365, filed on Mar. 31, 2010.

(51) Int. Cl.
*B23K 15/00* (2006.01)
*B23K 15/02* (2006.01)
(Continued)

(52) U.S. Cl.
CPC .............. *B23K 15/0086* (2013.01); *B23K 15/02* (2013.01); *B23K 15/06* (2013.01); *B23K 26/34* (2013.01); *B23K 26/345* (2013.01); *B23K 15/00* (2013.01)

(58) Field of Classification Search
CPC .... B23K 15/00; B23K 15/0086; B23K 15/02; B23K 26/34; B23K 26/345
USPC .............. 219/121.14, 121.13, 121.3, 76.12, 219/121.64, 121.63, 121.61, 121.62; 427/258, 595–597, 551, 552; 700/159, 700/166
See application file for complete search history.

(56) References Cited

U.S. PATENT DOCUMENTS 3,718,758 A 2/1973 Ponghis et al.
4,131,914 A 12/1978 Bricmont
(Continued)

FOREIGN PATENT DOCUMENTS

EP 1765003 A1 3/2007
EP 2119530 A1 11/2009
(Continued)

OTHER PUBLICATIONS

Seufzer and Taminger, "Control of Space-based electron Beam Free Form Fabrication" (accessed at ntrs.nasa.gov/archive/nasa/casi.ntrs.nasa.gov/20070030308_2007030399.pdf) (Oct. 23, 2007.).
(Continued)

*Primary Examiner* — Samuel M Heinrich
(74) *Attorney, Agent, or Firm* — The Dobrusin Law Firm, P.C.

(57) ABSTRACT

A method for layer-by-layer manufacturing of a three-dimensional work piece, including: (a) delivering a metallic feed material into a feed region; (b) emitting an electron beam; (c) translating the electron beam through a first predetermined raster pattern frame that includes: (i) a plurality of points within the feed region; and (ii) a plurality of points in a substrate region that is outside of the feed region; (d) monitoring a condition of the feed region or the substrate region for the occurrence of any deviation from a predetermined condition; (e) upon detecting of any deviation, translating the electron beam through at least one second predetermined raster pattern frame that maintains the melting beam power density level substantially the same, but alters the substrate beam power density level; and (f) repeating steps (a) through (e) at one or more second locations for building up layer-by-layer.

20 Claims, 5 Drawing Sheets

(51) Int. Cl.
*B23K 26/34* (2014.01)
*B23K 15/06* (2006.01)

(56) References Cited

U.S. PATENT DOCUMENTS

| | | | |
|---|---|---|---|
| 4,323,756 A | 4/1982 | Brown et al. | |
| 4,794,259 A | 12/1988 | Sanderson | |
| 4,898,317 A | 2/1990 | Ito et al. | |
| 4,920,776 A | 5/1990 | Denzler | |
| 4,927,992 A | 5/1990 | Whitlow et al. | |
| 4,998,004 A | 3/1991 | Lawrence et al. | |
| 5,065,029 A | 11/1991 | Krivanek | |
| 5,149,934 A | 9/1992 | Haynie et al. | |
| 5,151,571 A | 9/1992 | Sanderson et al. | |
| 5,162,906 A | 11/1992 | Yorita et al. | |
| 5,294,771 A | 3/1994 | Pratt | |
| 5,517,420 A * | 5/1996 | Kinsman et al. | 700/166 |
| 5,534,314 A | 7/1996 | Wadley et al. | |
| 5,557,110 A | 9/1996 | Itoh | |
| 5,596,228 A | 1/1997 | Anderton et al. | |
| 5,669,433 A | 9/1997 | Sterett et al. | |
| 5,736,072 A | 4/1998 | Satoh | |
| 5,736,073 A | 4/1998 | Wadley et al. | |
| 5,805,620 A | 9/1998 | Liu et al. | |
| 5,869,801 A | 2/1999 | Paton et al. | |
| 5,871,805 A | 2/1999 | Lemelson | |
| 5,947,179 A | 9/1999 | Kinane et al. | |
| 5,960,853 A | 10/1999 | Sterett et al. | |
| 6,046,426 A | 4/2000 | Jeantette et al. | |
| 6,091,444 A | 7/2000 | McCarville et al. | |
| 6,143,378 A | 11/2000 | Harwell | |
| 6,193,923 B1 | 2/2001 | Leyden et al. | |
| 6,229,563 B1 | 5/2001 | Miller, II et al. | |
| 6,399,945 B1 | 6/2002 | Hirayanagi | |
| 6,401,001 B1 | 6/2002 | Jang et al. | |
| 6,405,095 B1 | 6/2002 | Jang et al. | |
| 6,459,951 B1 * | 10/2002 | Griffith et al. | 700/166 |
| 6,472,029 B1 | 10/2002 | Skszek | |
| 6,580,959 B1 | 6/2003 | Mazumder | |
| 6,680,456 B2 | 1/2004 | Adams | |
| 6,707,003 B2 * | 3/2004 | Rouault | 219/137 R |
| 6,710,280 B2 | 3/2004 | Mazumder et al. | |
| 6,778,209 B1 | 8/2004 | Eversole et al. | |
| 6,793,140 B2 | 9/2004 | Mazumder | |
| 6,815,685 B2 | 11/2004 | Wany | |
| 6,859,681 B1 | 2/2005 | Alexander | |
| 6,937,921 B1 | 8/2005 | Mazumder | |
| 6,995,334 B1 | 2/2006 | Kovacevic et al. | |
| 7,020,539 B1 * | 3/2006 | Kovacevic et al. | 700/166 |
| 7,073,561 B1 | 7/2006 | Henn | |
| 7,107,118 B2 | 9/2006 | Orozco et al. | |
| 7,168,935 B1 | 1/2007 | Taminger et al. | |
| 7,262,385 B2 | 8/2007 | Fuson | |
| 7,326,377 B2 | 2/2008 | Adams | |
| 7,380,697 B2 | 6/2008 | Seki | |
| 7,648,740 B2 | 1/2010 | Slaughter | |
| 7,765,022 B2 | 7/2010 | Mazumder et al. | |
| 8,344,281 B2 | 1/2013 | Taminger et al. | |
| 2003/0075836 A1 | 4/2003 | Fong | |
| 2005/0173380 A1 | 8/2005 | Carbone | |
| 2005/0288813 A1 | 12/2005 | Yang et al. | |
| 2006/0050147 A1 | 3/2006 | Gao et al. | |
| 2007/0017908 A1 | 1/2007 | Sercel et al. | |
| 2008/0296278 A1 | 12/2008 | Meckler | |
| 2008/0314878 A1 | 12/2008 | Cai et al. | |
| 2009/0134005 A1 | 5/2009 | Sato et al. | |
| 2010/0122901 A1 | 5/2010 | Weinstein et al. | |
| 2010/0260410 A1 | 10/2010 | Taminger et al. | |
| 2010/0270274 A1 | 10/2010 | Taminger et al. | |
| 2010/0325902 A1 | 12/2010 | Dutta et al. | |
| 2011/0008530 A1 | 1/2011 | Woods et al. | |

FOREIGN PATENT DOCUMENTS

| | | |
|---|---|---|
| JP | 11/179578 A | 7/1999 |
| WO | 99/36738 A1 | 7/1999 |
| WO | 01/36146 A1 | 5/2001 |
| WO | 2004/020139 A1 | 3/2004 |
| WO | 2007/000069 A1 | 1/2007 |

OTHER PUBLICATIONS

Sharma, "On Electron Beam Addictive Manufacturing Process for Titanium Alloys"(Abstract for Session on Apr. 27, 2009 Spring 2009 AIChE National Meeting).
Matz, John, "Carbide Formation in a Nickel-Based Superalloy During Electron Beam Solid Freeform Fabrication," Jul. 30, 1999, pp. 1-94.
Dave', V.R. et al., "Electron Beam Solid Freeform Fabrication of Metal Parts," 1999, p. 64-71.
Taminger, Karen "Airbus Materials and Structures Workshop," Metals & Thermal Structures Branch NASA Langley Research Center, Electron beam Freeform Fabrication Technology Development for Aerospace Applications, Apr. 6-7, 2006.
Taminger, Karen et al., "Electron Beam Freeform Fabrication in the Space Environment," Jun. 25-28, 2007.
Taminger, Karen et al., "Solid Freeform Fabrication: An Enabling Technology for Future Space Missions," Apr. 8-10, 2002.
Caryn Meissner, "Standardizing the Art of Electron-Beam Welding," S&TR, Mar./Apr. 2008, p. 11-13.
Beersiek Joerg, "New Aspects of Monitoring with a CMOS camera for Laser Materials Processing," published at ICALEO 2002, Section F206.
Plasma Monitoring PM 7000.; Prometec GmbH, 2003.
J. Beersiek, T. Devermann, K. Behler; "Practical Applications of In-Process Monitoring For Laser Processes Not Only For Single Welds And Common Materials," 2004.
J. Beersiek; "A CMOS Camera as a Tool For Process Analysis Not Only For Laser Beam Welding," published at ICALEO 2001.
Process Monitoring System Welding Monitor PD 2000, 2006.
Process Control Laser Welding, Welding Monitor PD 2000, available at http://www.prometec.com/english/pages/contents/laser_pd2000_con.htm, last accessed Dec. 18, 2008.
R. Thompson, SCIAKY W2000, A Multiple Weld Process CNC Machine Controller, 1997.
W-2000 Computer Control System, p. 1-14, Mar. 2000.
Y. Fukui, "Modulation Transfer Function (MTF)," p. 1-2, Mar. 20, 2003.
S. Stecker, K.W. Lachenberg, H. Wang, and R.C. Salo, Electron Beam Free Form Fabrication Technology, International Institute of Welding, p. 1-13, Oct. 4, 2006.
Stecker, S., K.W. Lachenberg, H. Wang, and R.C. Salo, "Advanced Electron Beam Free Form Fabrication Methods & Technology," p. 35-46 Oct. 2006.
Photon Focus, High-Dynamic CMOS Cameras; available at http://www.photonfocus.com/html/eng/products/products/php?prodId=24 last accessed Sep. 2010.
K. Taminger; "Electron Beam Freeform Fabrication," 2005.
Davé, V.R.: "Electron Beam Assisted Materials Fabrication," Diss. Massachusetts Institute of Technology (MIT) (1995).
K. Taminger and R. Hafley; "Characterization of 2219 Aluminum Produced by Electron Beam Freeform Fabrication." Aug. 5-7, 2002.
K. Taminger and R. Haley; "Electron Beam Freeform Fabrication for Cost Effective Near-Net Shape Manufacturing," Mar. 2006.
V.R. Dave, J.E. Matz, T.W. Eagar; "Electron Beam Solid Freeform Fabrication of Metal Parts," p. 64-71, 1995.
Taminger, K. and R. Hafley; "Electron Beam Freeform Fabrication: A Rapid Metal Deposition Process"; Proceeding of the 3rd Annual Automotive Composites Conference SPE (2003).
Electron Beams: Useful for More than Just Microscopes, European Tool and Mouldmaking, Mar./Apr. 2002, http://www.tool~moldmaking.com/magazine/magdetail.php?company=2355&x=11&y=15, accessed Jul. 3, 2003.
J.E.Matz and T.W. Eagar; "Carbide Formation in Alloy 718 during Electron-Beam Solid Freeform Fabrication," vol. 33A, Aug. 2002.

(56) References Cited

OTHER PUBLICATIONS

Hamilton Standard W2, Electron Beam Welder; http://www.wme-inc.com/WebPages/EBWpgs/HSDW-2EBW.htm; accessed Sep. 29, 2009.
Fuentek, NASA's EBF3: The Future of Art-to-Part Manufacturing, available at: http://www.fuentek.com/technologies/EBF3.htm, last accessed Sep. 11, 2009, pp. 1-7.
Martin, R. et al, "Reducing Costs on Aircraft: The Metals Affordability Initiative," available at: http://www.tms.org/pubs/journals/JOM/0003/Martin-0003.html, accessed on Jan. 22, 2006, JOM 52(3) (2000) pp. 24-28.
Abbott et al, "Effects of Deposition and Thermal Processing Variables on Laser Additive Manufactured Ti-6A1-4V ", 2003, Metals Affordability Initiative, AeroMat Jun. 11, 2003, pp. 1-25.
SAI Titanium Specialists, article available at: http://www.supraalloys.com/Matching_titanium.htm, last accessed Jan. 22, 2006.
Cooper, K., "Extending Rapid Prototyping Past the Horizon: Applications in Outer Space," Published Jan. 10, 2001. Abstract.
Lachenberg, K. "Electron Beam Free Form Fabrication (EBFFF) Processing Methods & Technology," Aeromat 2007 Jun. 25-28, 2007.
Copending U.S. Appl. No. 12/883,340, filed Sep. 16, 2010.
Copending U.S. Appl. No. 12/902,520, filed Oct. 12, 2010.
International Search Report and Written Opinion, Application No. PCT/US2010/049044, dated Sep. 16, 2010.
International Search Report and Written Opinion, Application No. PCT/US2010/052261, dated Oct. 12, 2010.
Stecker, S. Characterization and application of weld pool oscilation phenomenon for penetration control of gas tungsten arc welding, A Thesis—The Ohio State University (1996).
Nazarenko, O. "Welding Electron Beam Analyzer", available at http://www.nas.gov.ua/pwj/beam/il3c.html, Copyright 1999-2008 last accessed Mar. 2, 2009.
Nazarenko, O. "Founded in 1976, Electron Beam Welding Department of PWI Brings Advanced Technology and Equipment From The Laboratory To Industry For Materials Processing Applications.", available at http://www.nas.gov.ua/pwj/beam/index.html, Copyright 1999-2009 last accessed May 11, 2009.
Nazarenko, O. "Range of the KL-109, KL-110, and KL-111 Universal Machines for Electron Beam Welding of Large and Thick-Walled Products" available at http://www.nas.gov.ua/pwj/beam/mach.html, Copyright 1999-2010 last accessed May 5, 2011.
Taminger, K. "Electron Beam Freeform Fabrication: A metal deposition apparatus to build components directly from CAD" WBT Showcase, Mar. 26-27, 2008. www.nasa.gov.
Brice, C.A., et al., "Rapid Prototyping and Freeform via Electron Beam Welding Deposition," Proceeding of Welding Conference, (2002).
Hofmeister, W. "Thermal imaging and control of electron beam freeform fabrication (ebf3)" NASA Space Institute.
Related Patent Application Office Action, U.S. Appl. No. 12/902,520, dated Oct. 4, 2012.
International Search Report and Written Opinion, Application No. PCT/US2011/025210, dated May 25, 2011.

\* cited by examiner

RASTER METHODOLOGY, APPARATUS AND SYSTEM FOR ELECTRON BEAM LAYER MANUFACTURING USING CLOSED LOOP CONTROL

CLAIM OF PRIORITY

This application is a continuation of Ser. No. 13/029,306 filed on Feb. 17, 2011 which is a non-provisional of Ser. No. 61/319,365, filed on Mar. 31, 2010, all of which are incorporated herein by reference for all purposes.

CLAIM OF BENEFIT OF FILING DATE

The present application claims the benefit of the filing date of U.S. Provisional Application No. 61/319,365, filed Mar. 31, 2010, the contents of which are hereby expressly incorporated by reference.

FIELD OF THE INVENTION

The present invention relates generally to layer manufacturing of articles and, more specifically, to additive manufacturing, direct manufacturing or solid freeform fabrication of articles using an electron beam gun.

BACKGROUND OF THE INVENTION

Free form fabrication (FFF), direct manufacturing (DM), and additive manufacturing (AM) are names for a general class of layer manufacturing (LM), in which a three-dimensional (3-D) article is made by the sequential build-up of layers of material. One or more suitable LM techniques may be utilized for making articles, (e.g., such as by creating one or more device patterns directly on a substrate). The LM technique usually includes a step of selectively depositing material layer by layer, selectively removing material layer by layer, or a combination thereof. Many LM techniques are attractive in that they avoid the need for masks, for pre-existing three-dimensional patterns, and/or expensive tooling.

As it pertains to making metallic articles by LM, one approach that has gained momentum in recent years has been to employ electron beam energy to heat and melt an advancing supply of a feed material. Efforts to address some of the problems encountered in LM, particularly LM processing that employs electron beam energy and closed loop control methodologies, are described in U.S. Application No. 61/243,242 (incorporated by reference), which discloses various unique approaches to layer manufacturing. In general, these approaches address deposition condition monitoring by use of optical approaches, such as by monitoring with digital camera equipment. Notwithstanding the early success of such a system, there remains a need for other robust approaches to deposition condition monitoring. U.S. Application No. 61/261,090 (incorporated by reference) discloses another approach to monitoring conditions during an LM operation that includes monitoring a molten pool deposit for at least one preselected condition, such as width, by detecting electrons from an emitted beam.

Notwithstanding the success of the above efforts directed at monitoring, there remains a need for improved LM technologies, especially in connection with the ability to manage energy that is emitted (e.g., by an electron beam gun) during an LM operation, so that efficient melting and solidification is possible, with minimal interruption to manufacturing.

By way of background, it has been observed that for successful deposition of a material such as a metal onto a dynamically changing substrate during LM there are at least two competing heat conditions that must be considered. A first condition is the heat to which a feed material is subjected to melt it. A second condition is the heat to which a molten pool resulting from deposition of the feed material, and possibly at least some of the surrounding solidified material, is subjected. In theory, it may be possible to predict the first condition, as it will generally be dictated by factors such as feed rate, specific heat, and melting temperature of the feed material. The second condition, however, is not readily predictable, as it will depend upon the amount of material that is deposited; the amount of material that has solidified (in contrast with that which is in a liquid state); the geometry of the resulting workpiece (inasmuch as that will affect the heat transfer and/or thermal mass characteristics of the workpiece); and other considerations that are continually changing in the course of material deposition. One approach to manage these competing conditions may be to employ a first energy source that melts the feed material, and a second independent energy source that manages the heat delivered to the molten pool, the surrounding solidified material, or both. For example, the use of two or more separate electron beam guns may be employed, one for each purpose.

It has been proposed in U.S. Application No. 61/243,242 (incorporated by reference) and U.S. Application No. 61/261,090 (incorporated by reference) to monitor the molten pool and make adjustments to a processing condition based upon information from such monitoring. For example, it describes monitoring the size (e.g., width) of the molten pool, and based upon information obtained, changing one or more processing conditions in an effort to maintain the molten pool within a predetermined size range.

It would be quite attractive for a LM process, particularly one that employs a closed loop control system, to be able to operate while maintaining, generally constant, as many processing conditions as possible. It would also be attractive to achieve such operation in an LM process with minimal investment in equipment. For example, it would be attractive to have an LM system that only requires the employment of a single electron beam gun.

Examples of efforts to provide layer manufacturing of articles and processes include those disclosed in U.S. Pat. Nos. 5,534,314; 5,669,433; 5,736,073; 5,871,805; 5,960,853; 6,401,001; 6,193,923; 6,405,095; 6,459,951; 6,680,456; 7,073,561; 7,168,935; and 7,326,377; and US Patent Application Nos. 20030075836; 20050173380; and 20050288813, all of which are incorporated by reference for all purposes. The possibility of closed loop controls for additive manufacturing of articles by electron beam fabrication processes is identified at col. 12, lines 8-15 in U.S. Pat. No. 7,168,935 (incorporated by reference). In Seufzer and Taminger, "Control of Space-based electron Beam Free Form Fabrication" (accessed at ntrs.nasa.gov/archive/nasa/casi.ntrs.nase.gov/20070030308_2007030399.pdf) (incorporated by reference), the authors address a possible approach to a closed-loop control system. See also, Sharma, "On Electron Beam Additive Manufacturing Process for Titanium Alloys" (Abstract for Session on Apr. 27, 2009 Spring 2009 AIChE National Meeting) (incorporated by reference).

U.S. Pat. No. 6,091,444 (incorporated by reference) elaborates on some of the difficulties faced in imaging high temperature melts. The patent illustrates an example of a high temperature melt view camera that includes a water cooled enclosure with a pinhole in it, through which a gas is passed.

An example of an electron image detector configuration is illustrated in U.S. Pat. No. 4,794,259 (incorporated by reference).

Until the present invention, notwithstanding efforts by others, the above-described needs for improvements in LM systems have remained unmet.

SUMMARY OF THE INVENTION

The present teachings meet some or all of the above needs, and particularly the need for managing the at least two heat conditions that arise in the course of LM manufacture, by providing a method for layer-by-layer manufacturing of a three-dimensional metallic work piece, comprising the steps of: delivering a metallic feed material in a substantially solid state into a feed region; emitting an electron beam having one or more predetermined electrical currents; translating the electron beam through a first predetermined raster pattern frame in an x-y plane that includes: a plurality of points within the feed region sufficient so that the metallic feed material is subjected to a melting beam power density level sufficient to cause melting of the metallic feed material and formation of a molten pool deposit; and a plurality of points in a substrate region that are outside of the feed region, sufficient so that the plurality of points outside the feed region are subjected to a substrate beam power density level that is different from (e.g., lower than) the melting beam power density level; monitoring a condition of one or both of the feed region or the substrate region substantially in real time for the occurrence of any deviation from a predetermined condition; upon detecting of any deviation, translating the electron beam through at least one second predetermined raster pattern frame in the x-y plane that maintains the melting beam power density level substantially the same as the first predetermined raster pattern frame, but alters the substrate beam power density level in a manner so that the monitored condition returns to the predetermined condition; and repeating the above steps at one or more second locations for building up layer by layer, generally along a z-axis that is orthogonal to the x-y plane, a three-dimensional layered metallic work piece.

As can be appreciated, in accordance with the above, it may be possible that the steps are performed for delivering a substantially constant and known amount of heat per unit time to a feed material of a generally constant composition, size, and geometry, which may be fed at a substantially constant rate, while dynamically altering the amount of heat to which a molten pool deposit and/or surrounding solidified material is subjected. This may be done with a single energy source, e.g., with a single electron beam gun. It will be appreciated that at the commencement of the process, the melting beam power density level in the feed region is substantially the same as the melting beam power density level in the substrate region.

In this regard, the invention may be further characterized by one or any combination of the following features such as that the step of delivering the metallic feed material may include advancing a metallic wire feed at a substantially constant feed rate. The step of emitting an electron beam during successively repeating steps may include emitting a beam using a substantially constant clock rate throughout the repeating steps. Any translating of the electron beam may include deflecting the beam (e.g., with one or more electromagnetic coils). The translating step may include translating from point to point at a substantially constant clock rate. Throughout the steps a substantially constant frame rate may be employed. A substantially constant frame rate of at least about 1 kHz (e.g., about 1.4 kHz) may be employed, a clock rate in excess of 1 MHz (e.g., about 1.4 MHz) is employed, or both. The molten pool deposit may have a forward edge region in an x-y plane with a forward edge region width and a trailing edge region in the x-y plane with a trailing edge region width, and the step of monitoring the molten pool deposit may monitor either or both of the forward edge region width or the trailing edge region width, and steps (a)-(e) are performed for maintaining a substantially constant molten pool deposit width at either or both of the forward edge region or the trailing edge region. The electron beam may remain at a substantially constant focus throughout repetitions of steps. The teachings herein also contemplate an apparatus that includes an electronic control device that performs any of the methods herein, as well as articles made according to such methods.

DETAILED DESCRIPTION OF THE INVENTION

As used herein, unless otherwise stated, the following terms have the following meanings:

The term "point" shall refer to a target location for a beam.

The phrase "raster pattern" shall refer to a two dimensional (x-y) scan pattern of points over which a beam is manipulated.

The term "frame" shall refer to a single complete cycle performed by a raster scan of a beam in order to complete a single entire raster pattern.

The phrase "frame rate" shall refer to the rate at which a frame is executed.

The phrase "clock rate" shall refer to the rate at which consecutive points are realized by the beam.

The phrase "point density" shall refer the number of points per unit area.

The phrase "power density" shall refer to an amount of power that is distributed to a unit area from the beam.

The present teachings are premised upon improvements in an apparatus and process for layer manufacturing (LM) of a three-dimensional article. The invention is particularly directed at an apparatus and process for LM that can employ a single electron beam gun (or other energy beam generator) that is controlled so that (i) control over a beam raster pattern is realized for achieving one or more different heating characteristics (e.g. different power densities) in different regions within a single raster frame, and (ii) dynamic control (e.g., dynamic frame-by-frame control) over a beam raster pattern may be realized during deposition of a molten metal onto a substrate, to take into account one or more conditions being monitored about a molten pool deposit (e.g., preferably as part of a closed loop control process). More specifically, the teachings are premised upon an elegant and surprisingly simple approach to the control of an energy beam (e.g., an electron beam), that can be executed while maintaining substantially constant heating conditions for a region encompassing at least a portion of the feed material (which may be supplied at a substantially constant rate, at a variable rate, or both), with variations to conditions for other regions that take into account the dynamic conditions (e.g., its heat condition) of the work piece as it is being built.

In general, the teachings herein contemplate that, during or even throughout deposition of a feed material, at least one substantially constant power or energy amount is delivered to the feed material so that the feed material is melted (e.g., at a substantially constant melting rate). The teachings also contemplate that, during or even throughout deposition of a feed material, a variable power or energy amount is delivered to a region that generally is external of the feed material. The variable power or energy amount may be one or more amounts that increase, decrease, or both during the depositing. Desirably, the power or energy is delivered via a single electron beam source. Accordingly, the teachings herein contemplate that a single electron beam source can be dynamically controlled so that a feed material can be melted (e.g., using a substantially constant application of power to the feed material and/or at a substantially constant rate) to deposit the feed material in a molten state to form a workpiece. The single electron beam source may simultaneously control the power or energy delivered to the region of the workpiece substantially surrounding the feed material so that the power or energy is dynamically altered to increase, decrease, or maintain the temperature of the workpiece at a predetermined level. A single electron beam source (e.g., a single electron beam gun) is employed and controlled to independently control temperatures in at least two discrete regions (e.g., two or more adjoining regions, with one region (e.g., a feed region) being maintained at or above the melting temperature of the feed material, and another region ((e.g., a substrate region) being maintained below the melting temperature of the feed material).

In another particular aspect, the teachings herein contemplate delivering power or energy for melting feed material, maintaining a molten pool deposit of the feed material, and heating a workpiece as it is being made layer-by-layer so that one or more characteristics of the molten pool deposit are maintained within a predetermined range of acceptable values. If and when deviations from the predetermined range of acceptable values is detected, then the supply of power or energy is preferably automatically altered to result in a return to a value within the predetermined range of acceptable values. It is envisioned that power or energy will be supplied by way of a raster pattern that includes at least one feed region (e.g., a region in the path of a scanning beam through which the feed material transcends as it is delivered from its solid state to the molten pool deposit) and at least one substrate region (e.g., a region in the path of a scanning beam that heats the substrate and generally surrounds the feed region) through which the feed material transcends as it is delivered from its solid state to the molten pool deposit. Either or both of point density or power density may be different (e.g., higher) in any feed region than in any substrate region (e.g., by an order of at least 1.5, 2, 5, or even at least 10 times). The automatic alteration may be achieved in a preferred aspect of the present teachings by selecting and varying (e.g., as between successive frames) a processing condition, and more particularly a processing condition such as the raster pattern, the power or energy delivered at one or more points, the power density of any feed region, substrate region, both, or any combination thereof.

In general, the process may include supplying a material (e.g., a wire feed material); liquefying the material (e.g., by applying power or energy, such as from an electron beam); depositing liquefied material onto a work piece support as a molten pool deposit; monitoring the molten pool deposit by use of detection of one or more electron phenomena that occurs from emission from the electron beam generator and interaction with the molten pool deposit; and controlling operation of the process using a closed loop control system for changing an operating parameter in response to a detected condition of the molten pool deposit. The process specifically contemplates the employment of one or more steps of applying power in two or more preselected density levels to a work piece during manufacture, over two or more preselected regions within a frame, so that the heat to which a feed material is subjected can be maintained at a different (e.g., higher) level than the metal work piece that has solidified. The process may be performed while maintaining at least one substantially constant molten pool deposit size condition, such as width.

The process may be performed while delivering the feed material at a substantially constant feed rate, at a variable feed rate, or both. The process may be performed while operating the beam current at a substantially constant current, a variable current or both (e.g., from frame to frame, current may be increased, decreased, or both). The process may be performed while operating the material feed rate at a substantially constant rate, a variable rate, or both (e.g., from frame to frame, material feed rate may be increased, decreased, or both). The process may be performed while maintaining a substantially constant frame rate, a variable frame rate, or both. The process may be performed while maintaining a substantially constant clock rate, a variable clock rate, or both (e.g., from frame to frame, the clock rate may be increased, decreased, or both). The process may be performed by maintaining a substantially constant number of points per frame, a variable number of points per frame, or both (e.g., from frame to frame, points may be added, subtracted, or both). The process may be performed by maintaining a substantially constant number of points per frame, but varying distance between points (e.g., from frame to frame, spacing (which may be substantially uniform or not) between two or more points may be increased, decreased, or both). The process may be performed by maintaining dwell time at a particular point at a constant amount, a variable amount, or both (e.g., from frame to frame, dwell time at each point may be increased, decreased, or both). Any combination of the processing variables in this paragraph may be employed together. One specific approach envisions maintaining a substantially constant number of points from frame to frame, but changing the distance between points within a frame (e.g., points are reallocated within a frame so that a different (e.g., higher) density of points is located in a wire region than in a surrounding substrate region). It will be appreciated that the variations addressed in this paragraph and elsewhere in the present teachings may be done on a frame by frame basis, within a specific frame, or both.

Desirably, a closed loop control operation may be employed so that as layer by layer buildup is occurring, one or more characteristics of the work piece is monitored during manufacture, and processing conditions are modified to take into account deviations from predetermined values for such characteristics. For example, one approach contemplates that a size (e.g., a width) of a molten pool deposit is monitored. If it is detected that the size is fluctuating outside a predetermined range of sizes, one or more processing conditions are adjusted until the fluctuation is reduced to a desired level. For example, it is possible that, to mitigate the fluctuation, one or more steps of changing power density distribution within a frame may be employed as between two or more successive frames. In this manner, it can be seen that with very few processing condition variations, it is possible to achieve consistent and reproducible control over a resulting LM work piece. Thus, simplification of energy or power management is possible by altering relatively few or even as little as one variable (e.g., power density) on a frame by frame basis.

In general, an apparatus in accordance with the present teachings may include a material delivery device for delivering a feed material in a solid state (which may include at least one metal). Wire may be used as the feed material, and its feed rate can be precisely controlled (e.g., feed rate may be substantially constant). The wire may be fed into the molten pool established by the electron beam though a suitable guide nozzle. The distance between the electron beam and the work piece (e.g., the molten pool in the work piece) may be controlled so that the raw material being deposited is a generally continuous stream of material from the feed wire to the pool deposit (e.g., droplets are substantially avoided). The distance between the electron beam and the work piece (e.g., the molten pool in the work piece) may be controlled so that the raw material being deposited does not accumulate and solidify prematurely in a given location. It is also possible that an apparatus within the present teachings may be outfitted with a servo driven wire feeder that includes a wire straightener and can accommodate wire feed rates up to about 300 inches per minute (IPM) with wire diameters ranging from about 0.030" to about 0.156". The material delivery device may be adjustable for feeding relatively large or even relatively small diameter wires (e.g., wires supplied by a wire spool, may have a diameter below about 5 mm, below about 3 mm, or even below about 1 mm) at both high and low speeds. During deposition, the system herein may be operated and controlled so that there is a continuous and generally uninterrupted matter streaming from the solid wire to the liquid molten pool deposit. For example, the system may be operated and controlled so that there is no disconnection of the wire and the pool deposit and no droplet formation that arises in the feed path of the wire into the deposit.

The apparatus may include an energy emission device used for melting the feed material to form a molten pool deposit (e.g., onto a previously deposited layer). For example, the teachings herein contemplate an electron beam generation device may be controllably operated and may include a suitable mechanism for directing the location of an emitted energy beam, and thereby directing point location, so that two or more preselected power densities can be applied over two or more preselected regions to cause liquification of a material (e.g., a metal) delivered by the material delivery device, while at the same time avoiding undesired heat build-up in already deposited material of the workpiece. One preferred approach may, thus, involve the use of an electron beam generating device that also provides for focusing and/or deflecting the electron beam, and directing point location, by using one or more deflection coils, such as one or more programmable electromagnetic coils. Consistent with the teachings of U.S. Patent Application No. 61/261,090 (incorporated by reference), the electron beam generating device (e.g., an EB gun) may be used to supply the energy required to melt and fuse the deposited material, as well as to scan the deposited material for information about the deposit that can be used for a closed loop control operation. For example, the teachings herein contemplate using information about the detected electrons to issue a signal that controls the operation of the electron beam generating device such as its power, current, voltage, beam characteristic, or any combination thereof.

An electron beam gun such as the Sciaky low voltage 60/60 style electron beam gun may be employed. The gun may include fully NC programmable beam focus and deflection features, so that it may be used to perform all welding and deposition activities, as well as generate a beam to scan for monitoring one or more conditions. The gun may be such that it allows for programming and manipulating the electron beam through the use of electromagnetic coils. The operation of the gun may be configured so that there is synchronicity between the programmed beam raster pattern and the resulting detection signals. By way of example, a suitable EB gun may provide energy in the form of a stream of focused electrons accelerated towards the work piece by a high voltage potential (e.g., greater than about 15 kV, and even as high as about 30 kV, about 60 kV, about 100 kV, or even about 150 kV, or higher). The electrons may be generated within the EB gun via one or more heated filaments. The power output of the gun may be typically controlled by limiting or throttling the flow of electrons to the work piece. A maximum beam power in the range of up to about 10 kW to about 30 kW (e.g., about 3 kW to about 5 kW) may be employed. Beam current (BC) may be on the order of greater than about 100, 200, 300, 400 milliamps, or more may be employed. Beam power may be derived by using about 100 V to about 600 V (e.g., 110 V) input voltage. Electricity required to operate the electron beam generation device may be supplied from one or more suitable electrical sources, for example, electricity may be provided via at least one electrical feed-through supply.

The apparatus may also include a work piece support onto which liquefied material is deposited. The material delivery device, the beam generation device, and/or the work piece support may be translatable in a plurality of axes (e.g., 3, 4, 5, or 6 axes) relative to one another (any one of which may itself be fixed or translatable), so that a work piece can be formed layer by layer from a plurality of successively deposited (and solidified) molten pool deposits. By way of example, an electron beam welding and deposition system may be employed, such as one having components as found in the Sciaky model NG1 VX68. The apparatus thus may be a fully functioning electron beam welding and deposition system utilizing a low voltage moving gun technology. It may include multiple programmable CNC motion axes, e.g., some or all of XYZ linear and part rotation (R), part tilt (T), and electron beam gun tilt axes.

The apparatus also may include one or more detectors (e.g., a detector including a camera, an electron phenomena detecting mechanism, or a combination of both) for monitoring one or more steps performed by the apparatus, such as the monitoring of one or more conditions of a molten pool deposit. By way of example, a detector as disclosed in either or both of U.S. Patent Application Nos. 61/243,242 (incorporated by reference), 61/261,090 (incorporated by reference), or both may be employed, and may include a vapor protection device (e.g., a block adapted to allow a gas stream to enter at least one fluid port and exit the block so that metal vapor is prevented from entering the block), a cooled camera housing (e.g., one through which a heat transfer fluid can pass for helping to maintain the electronics housed in the housing below a predetermined temperature)). Thus, the detector may have a vapor protection device as described in U.S. Application No. 61/243,242 (incorporated by reference)(see, e.g., paragraphs 60-72 and associated drawings), a thermally regulated housing as described in U.S. Application No. 61/243,242 (incorporated by reference)(see, e.g., paragraphs 73-85 and associated drawings), or both. The detector may include a suitable structure configured to detected an electron phenomena, such as scatter (e.g., it may employ a detector that is at least partially surrounded by a cage or other structure (e.g., a structure having the functional and/or structural components as taught herein) which may be electrically biased to selectively allow passage through the structure (to the detector) of electrons of a predetermined energy level) as described in U.S. Application No. 61/261,090 (incorporated by reference) (see, e.g., paragraphs 37-62 and associated drawings). The detector may be located for monitoring a condition of a melt pool deposit from a location that is substantially overhead of the molten pool deposit. The detector may be configured so that it operates at a data (e.g., image) acquisition rate or frame rate that is equivalent to a rate of at least about at least about 10, 15, 20, 25, 30, 40, 50, or even 60 or more images per second. It may operate at even higher rates (e.g., at least about 100, 150, 250, or even 500 images per second).

The apparatus desirably includes one or more control systems for controllably operating the material delivery device, beam generation device (including any device for directing point location), and/or work piece support, preferably in response to information that is supplied by any detector. For example, an electronic control system may include a suitable control device, preferably including at least one microprocessor, such as a closed loop control in signaling communication with at least one or more of the material delivery device, beam generation device (including any associated beam deflector), or work piece support, and also with the detector, which signally controls operation of one or more of the material delivery device, beam generation device, or work piece support in response to information supplied by any such detector. By way of illustration, upon detecting a condition of material that has been deposited, a detector may supply information about the condition to the control device so that the control device can change an operating parameter in response to the detected condition. Thus, it is possible that the control may be employed for altering one or more processing parameters to alter one or more power density conditions on a frame-by-frame basis.

By way of further illustration, one or more of the controls (e.g., closed loop control device) and data acquisition may be electronically managed through a user interface and display device (e.g., suitable instrumentation, such as one or more computers). The closed loop electronic control device may acquire one or more signals obtained by the detector (e.g., substantially in real time, as the detector or any detecting device is monitoring the work piece). The closed loop electronic control device may process the signal by comparing it with a stored value (e.g., a value that is programmed into a database, a value from a previous reading, or both). Based upon the step of comparing, the closed loop electronic control device may issue a command that may cause the processing parameters to be changed to one or more different processing parameters (e.g., the closed loop electronic control includes a processor that is programmed to perform the comparison and then issue a certain signal based upon the results of the comparison). By way of example, the operation of the energy emission device may be controlled in a suitable manner to achieve a preselected size (e.g., width) for a deposited melt pool. The size or other condition of the deposited melt pool may be measured by the detector (e.g., metal melt pool deposits may be monitored and operations controlled to maintain successively deposited layers so that they exhibit a melt pool diameter or width of about 0.3 mm to about 20 mm, or even about 0.5 mm to about 13 mm). Upon detection of a difference between the actual condition (e.g., diameter or width) and the desired value, the control system may signal the electron beam gun and/or any associated hardware (e.g., the deflection coil) to change (e.g., as between two or more consecutive frames) one or more beam attributes (e.g., current, point density, or otherwise) in either or both of the feed region or the substrate region.

The entire system or components thereof may be programmed and controlled via Sciaky's W20X0 series CNC and process controller. It is also possible that the teachings herein may employ a separate dedicated computer in addition to the NG1 system controller. Such computer may be configured, for example, to provide a communication link to the NG1 primary controller via Ethernet and may allow for bidirectional data transfer. An example of a suitable closed loop control computer is a quad-core Intel Pentium system running standard operating system such as Microsoft® Windows XP. Examples of suitable software for programming of devices used herein may include software available from National Instruments (Austin, Tex.) under the designation NI Developer Suite (Including LabVIEW PDS, LabWindows/CVI, Measurement Studio, SignalExpress, LabVIEW, and LabWindows; and optionally Image Acquisition and Machine Vision Option for NI DevSuite (includes Vision Development Module, Vision Builder for Automated Inspection, and Vision Builder for AI Development Kit).

The time lapse between when a melt pool deposit is formed and when a condition is altered in response to a detected condition may be rapid, e.g. it may be less than about one minute, less than about 30 seconds, less than about 10 seconds, less than about 5 seconds, or even less than about 1 second. Thus, substantially real time condition adjustment is possible.

A suitable housing may define a chamber (e.g., a chamber that can be evacuated) within which some or all of the components may reside. At least a portion of one or more of the components (e.g., the control system, a computer, or both) may reside outside of the chamber.

Figure 1:
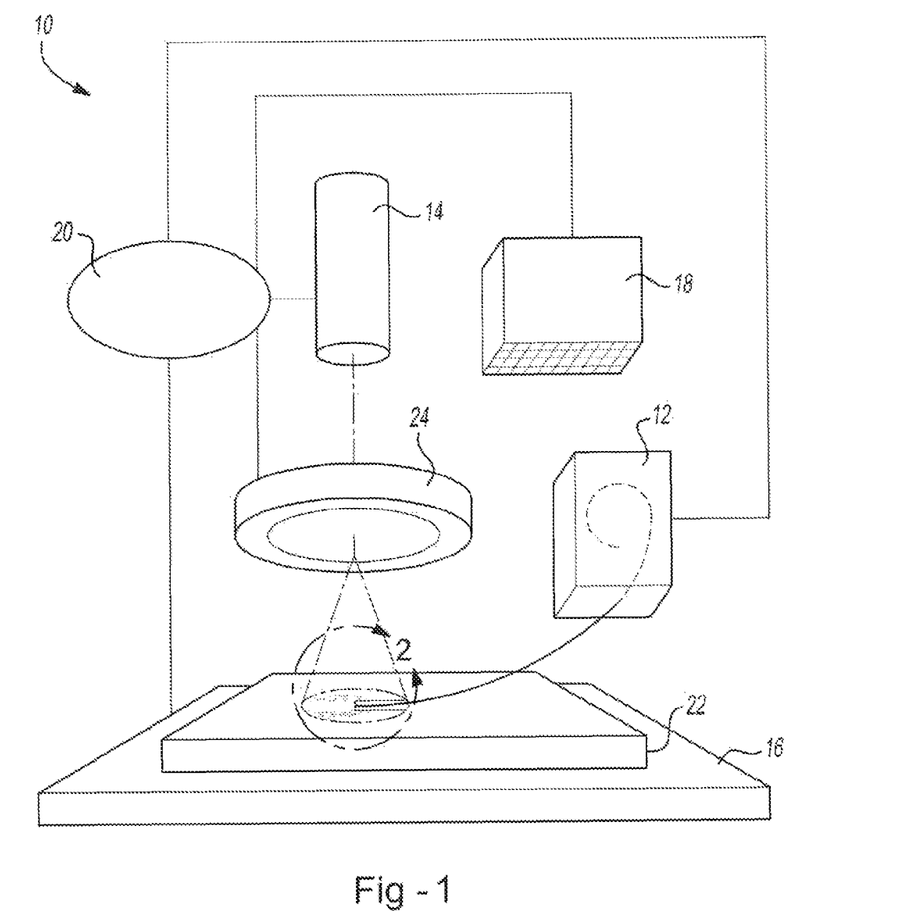
FIG. 1 is a schematic block diagram illustrating the components of an apparatus in accordance with the teachings herein.

By reference to FIG. 1 there is illustrated schematically one such system for use herein. The LM apparatus 10 includes a material delivery device 12 (FIG. 1B) for delivering raw material in a solid state (e.g., one or more metals in a wire form, a powder form or both). An electron beam generator (e.g. gun) 14 controllably emits an electron beam. A work-piece support 16 (e.g., a support that is motor-translated) is positioned so that the electron beam generator and the support may be translated relative to each other. One or more detectors 18 may be present and may be in signaling communication with a control system 20 (e.g., having one or more controllers), which may dynamically adjust processing parameters of one or more of the system components for building up a work piece 22, and which may be the same as or different from the control system for inducing a raster pattern of an electron beam, such as by controlling a deflector coil 24, such as an electromagnetic coil, located between the electron beam generator and the workpiece support 16.

Figure 2:
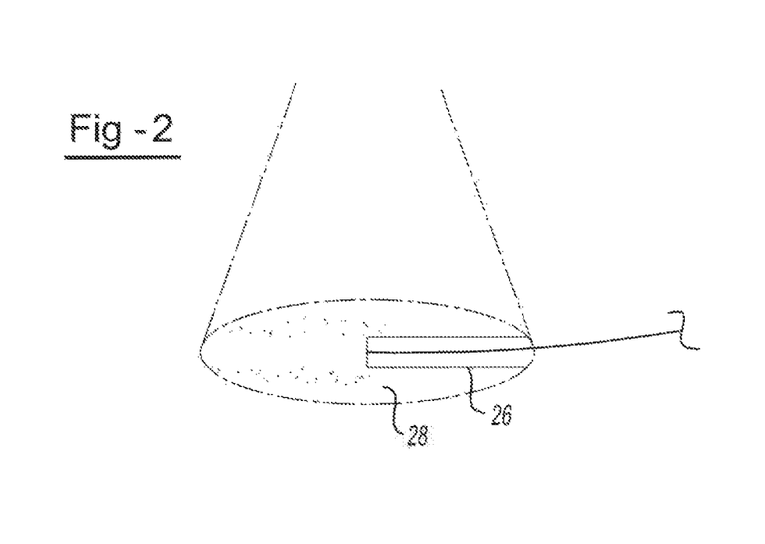
FIG. 2 is a perspective view of an illustrative deposition step.

FIG. 2 shows a magnified view of the circled portion of FIG. 1, and further illustrates how in the course of a raster frame there will be a feed region 26, which generally corresponds with the space occupied by a feed material while in the path of a scanning beam through which the feed material transcends as it is delivered from its solid state to the molten pool deposit. Though shown as a generally rectangular shape, the shape need not be so limited, and other shapes are possible. The region external of the feed region may include a substrate region 28. For instance, the substrate region may generally encompass the entire region through which a beam is translated during a raster frame, but not including the feed region.

A suitable enclosure for defining a chamber may be employed to enclose at least the material delivery device, electron beam generator, work piece support, and detector. The chamber may be evacuated as desired for processing. The pressure may be evacuated with a suitable vacuum pump so that the pressure within the chamber ranges from about $1\times10^{-1}$ to about $1\times10^{-7}$ torr (or possibly lower). The pressure within the chamber may be less than about 0.1 torr, preferably less than about $1\times10^{-2}$ torr, and more preferably less than about $1\times10^{-4}$ torr.

Any one or combination of the detectors herein may be used to generate an image from the detected signals. They may also be operated to provide information to a control device so that an image is unnecessary and is avoided. For example, the detectors may be operated to obtain information from a certain predetermined location or region, and to compare such information against stored values (e.g., predicted values, previously measured values or otherwise) for such location or region. Such comparing may be done, for example, by programming a predetermined value into a processor. Such comparing may involve ascertaining if a measured value meets a certain threshold value (e.g., a predicted value, a previously measured value or otherwise) and/or how it compares with a previously monitored value, that is sufficient to trigger a control operation to be perform. An alteration in processing condition may occur if a predetermined sufficient deviation between detected and stored and/or otherwise predetermined values is observed, or otherwise by evaluating how a measured value performs relative to a threshold value.

Figure 3:
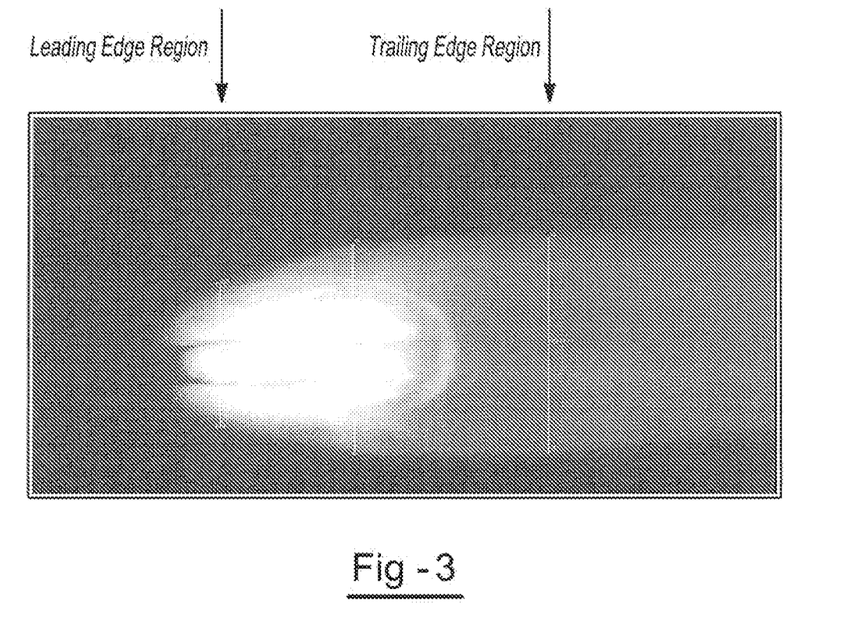
FIG. 3 is an illustration of how size (e.g., width) of a melt deposit may be analyzed.

By way of illustration, measurements may be taken at one or more locations, such as a leading edge region of a deposit (e.g., the edge region of the deposit that is located where molten metal is introduced into the molten pool), a trailing edge region (e.g., the region of a deposit that is in a state of cooling), and at which some solidification may even have commenced) of a deposit, or even along an intermediate location. This may be done, for example, when it is desired to measure pool deposit width. FIG. 3 shows an example of one possible image frame (for a wire feed) with several measurements being taken at various locations. By way of illustration, three (3) width measurements locations may be identified at locations referred to as the pool leading edge (shown as the furthest left side line spanning the width, corresponding approximately with the entry point of the wire at its midpoint), the pool mid-line, and the pool trailing edge region (shown in FIG. 3 as the furthest right side line spanning the width). The trailing edge region will be located upstream of the wire center. Thus, it is possible that width measurements are taken at one or more locations that is about 0.5 cm, about 1 cm, about 2 cm, about 3 cm, about 4 cm, about 5 cm, or further upstream of the feed center location (e.g., the wire center). A number of additional points are identified near the wire at the leading edge of the pool. Additional points about the wire (shown to the left of the leading edge) may be used to evaluate Z height information this image as well.

It is possible that an image may not be generated. Instead a limited detection may be done over a specific region (e.g., along one or multiple locations generally along the leading, intermediate, and/or trailing edge region of the pool). Data may be compared with stored predicted data or some other threshold, and an alteration to a processing condition performed as a result of the comparison. The closed loop electronic control system may then signally control (directly or indirectly) operation of one or more components of the apparatus in response to a detected condition.

Though the present teachings contemplate that effective closed loop control may be possible with alterations largely directed at power density modification, it may be employ one or more other processing alterations such as the location of any energy emission device for supplying energy to melt the raw material; the location of any material delivery device used; the location of the work piece support relative to the beam generator (e.g., electron beam generator travel velocity); the pressure and/or temperature of any environment in which the processing is performed; the voltage (e.g., accelerating voltage) or other energy (e.g., energy controlled by controlling beam current, accelerating voltage or both) supplied to melt the raw material; the beam used (e.g., the beam focus, the beam power, beam raster pattern, path, or other characteristic that may be controlled by controlling a deflection and/or processing coil parameter); the feed rate of the feed material or other feed control parameter (e.g., the timing when feed starts and/or stops); the composition of the deposited material; the temperature of the work piece; the temperature of the platform; or any combination thereof. In most instances, the teachings envision that there will be a frame by frame alteration of point densities for the feed region, the substrate region or both, so that a single gun is able to supply variable amounts of heat to each such region.

Feed materials may include one or any combination or alloy of metals (e.g., metals including a transition metal or an alloy thereof). Examples may include one or more of titanium, aluminum, iron, nickel, chromium, (e.g., inconel), cobalt, stainless steel, niobium, tantalum, copper, bronze, brass, beryllium, copper, vanadium, or tungsten. Particular examples of materials are titanium and alloys of titanium (e.g., also including aluminum, vanadium, or both), such as one including titanium in a major amount (or substantially the balance) and about 3-10 wt % Aluminum (Al) (more preferably about 6 wt %), and 0 to about 6 wt % Vanadium (V) (more preferably about 4 wt %)). The material may be supplied and/or fed in various shapes and sizes. In one preferred embodiment, the raw material is provided in the form of a wire feed stock. The materials may be provided in an already heat-treated (e.g., tempered) condition. It is also possible that the material may be provided as a powder, in which case, the material delivery device will be configured for metering a predetermined quantity of powder.

One approach to the operation of an electron beam gun may be to maintain the parameters of the gun at a sufficient level so that the maximum depth of a molten pool deposit may be maintained substantially constant at a depth less than about 3 cm, more preferably less than about 1 cm, and possibly even less than about 0.5 cm. It is possible that the beam may be operated in a generally defocused mode, a generally focused mode or both. In a preferred approach, the beam will be operated in a mode that maintains a generally constant focus of the beam (e.g., it is operated so that there is no need to change the focus of the beam during a raster frame or in subsequent raster frame). For the deposition of a material, scanning for detection, or both, the beam may be rastered in one or more suitable patterns, such as generally non-circular pattern (e.g., generally in an elliptical pattern, a linear pattern, a polygonal pattern, a spiral pattern, or any combination thereof). For example, a beam having a width of about 0.5 to about 0.8 mm may be rastered to cover an effective width of about 1.0, 2.0, 3.0 mm, or larger. In this manner, a relatively large amount of energy may be dispersed over a relatively large area, but to a relatively shallow depth, as compared with traditional electron beam welding.

Figure 4A:
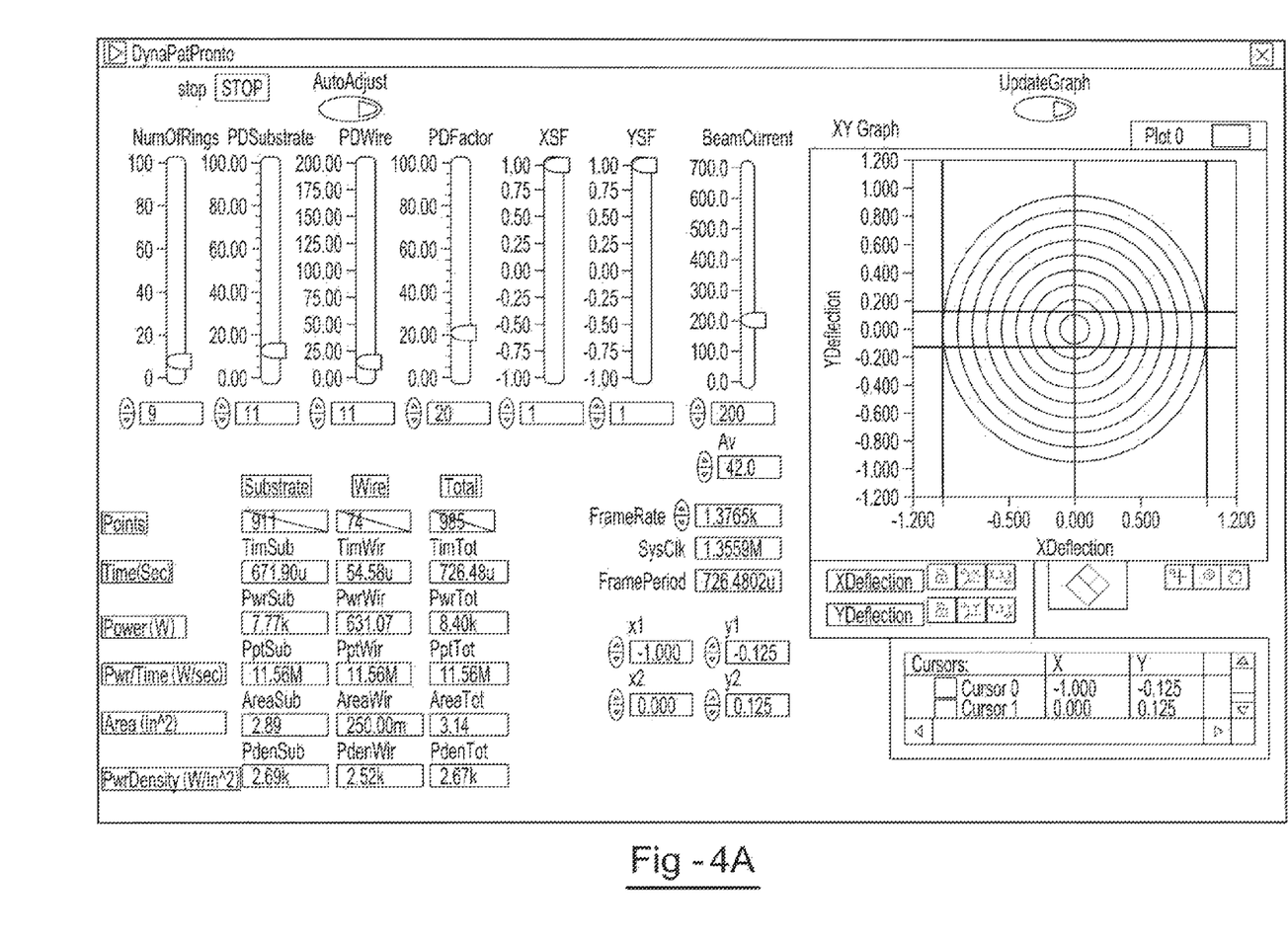
FIGS. 4A and 4B are examples of a graphical interface to illustrate operation of the teachings herein under a first set of processing conditions (FIG. 4A) and under a second set of processing conditions (FIG. 4B).
Figure 4B:
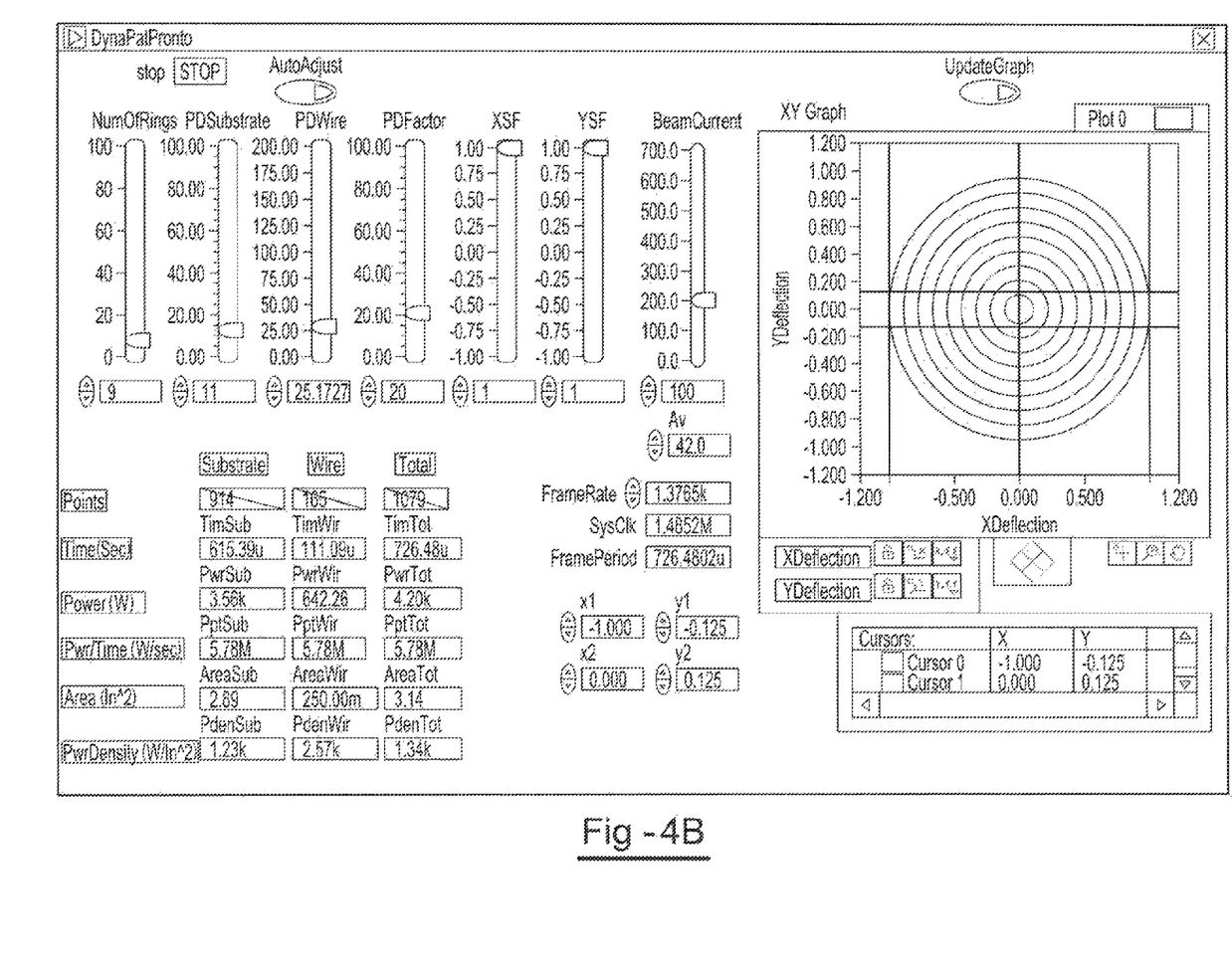

As discussed previously, one particularly preferred approach in accordance with the teachings is to employ rastering (e.g., of a single beam) sufficient that, during one or more individual frames, will transfer a differential in density of heat delivered per unit time as between at least two regions of a frame, such as a differential in density as between at least two regions (e.g., as between a feed region and a substrate region, which may adjoin the feed region). With reference to FIGS. 4A and 4B, a frame is depicted (in generally mirror symmetry to the regions illustrated in FIGS. 1 and 2) to include a plurality of regions which are illustrated by linear demarcations in that drawing. Dots illustrate points in the raster pattern. In the illustration shown, the raster pattern includes a plurality of concentric generally circular arrangements of points. Successive points between adjoining circular arrangements effectively can define a generally spiral configuration. For example, the feed region is shown in these drawings as the middle blocked region on the left half of the drawing, which generally encompasses the region in which the feed material is resident just prior to or as the feed material is introduced into a molten pool deposit. In the depiction of FIGS. 4A and 4B, the substrate region may include one or any combination of the boxed regions that adjoin the feed region. The substrate region, thus, may include at least a portion of, if not all of, the region surrounding or adjoining the feed region. It should be realized that it is possible that at least a portion of the molten pool deposit will be located in the substrate region.

As indicated previously, in addition to or in lieu of frame by frame alterations, any such raster pattern may be dynamically altered during each raster frame so that the power density that is distributed by a beam within the feed region is different from (e.g., higher than) the power density that is distributed by the beam within the substrate region. For example, in accordance with the teachings herein, it is contemplated that during each frame, a beam will be dynamically altered, such that the power per unit of time in one or both of the feed region or the substrate region may be different, so that separate heating conditions of the metallic feed material in the feed region and the substrate region can be achieved independently within a single frame using a single beam electron beam source.

Any of a number of different operational variations may be performed in accordance with the present teachings. It may be possible to initiate variations while a frame is being executed or just prior to start of a new frame (e.g., immediately upon completion of a frame). Variations to the beam may thus be on a frame-by-frame basis. It is possible that many frames will elapse without any variation, a variation will occur as between two or more consecutive frames, or both. One possible approach is to perform variations sufficient so that substantially constant power density for the feed region is maintained for a plurality of frames (e.g., for a sufficient number of frames so that one or a plurality of layers of metallic material can be built up as a work piece). In this manner, it is envisioned that processing conditions are maintained so that as multiple frames elapse the feed is subjected to a substantially constant amount of heat, sufficient for melting it, whereas the substrate region may be subjected to varying amounts of heat (e.g., less heat if a molten pool deposit dimension, such as width, exceeding a predetermined value is detected, more heat if a molten pool deposit dimension, such as width, below a predetermined value is detected, or both). Frame to frame beam variations may include one or more of varying the beam current, varying the point density (e.g., by increasing or decreasing the number of points and/or their locations) within either or both of the substrate or the feed region, varying the total time the beam spends in either or both of the substrate or the feed region, varying the power density within either or both of the substrate or the feed region. By way of example for a titanium-based wire feed (e.g., titanium wire having a diameter of less than about ¼ inch, or preferably on the order of about ⅛ inch), the teachings herein contemplate maintaining the power density for the feed region substantially constant in an amount of at least about 1.5 kW/in$^2$, about 2 kW/in$^2$. The teachings herein contemplate maintaining the power density for the feed region substantially constant in an amount of less than about 5 kW/in$^2$, or even less than about 3.5 kW/in$^2$. For example, it may be maintained at about 2.5 kW/in$^2$. Clock rates herein generally will be relatively rapid, and may exceed 0.5 MHz, or even 1 MHz. Frame rates may be at least about 0.5 kHz, or even 1 kHz.

By way of illustration of a dynamic alteration of a raster pattern, comparison may be made between FIGS. 4A and 4B. FIG. 4A illustrates an example in which there is a relatively low point density in the feed region. This may correspond for example with a scenario in which it is desired to heat the feed region and the molten pool deposit under a first set of processing conditions, such as conditions selected for maintaining each of the feed region and the substrate region at a first predetermined temperature. As mentioned, in accordance with the teachings herein, it is possible that the operations will be monitored, e.g., the width of the pool deposit will be monitored. FIG. 4B illustrates an example in which, during the course of monitoring, it is determined that either or both of insufficient heat is being applied to the feed or the substrate region has become too hot (e.g., as manifested by a growing pool deposit width). Accordingly, in FIG. 4B, it is seen how the point density in the feed region is increased as compared with FIG. 4A. Effectively, assuming a constant frame rate as compared with the state in FIG. 4A, power density in the feed region is increased in FIG. 4B.

Also illustrated in FIGS. 4A and 4B, are examples of user interfaces that may be employed for allowing an operator to establish and monitor processing. To help further understand the content of these figures, FIG. 4a shows settings for buildup of a work piece using a substantially constant beam current (e.g., 200 mA), and nominal values are employed as may be typically employed at the beginning of buildup with a metal wire feed (e.g., 0.125" Ti wire). It is seen that there will be setting for PDWire (point density, wire region) of 11, PdenWir (power density, wire region) of 2.52 kW/ln$^2$, and a FrameRate (frame rate) of 1.3765 kHz. Wire region corresponds to the feed region described herein and is located in the central rectangular region on the left half of the XY Graph.

For the illustration of FIG. 4b, beam current is illustrated as being reduced to 100 mA, yet power density of wire region is maintained substantially constant along with the frame rate. The number of points in wire region is shown as increasing (e.g., from 74 to 165).

It is possible within the present teachings that a beam will be dynamically altered, such that the power density per unit of time in one or both of the feed region or the substrate region may be different but may vary from one frame to another (e.g., in response to information obtained during the monitoring step), so that separate heating conditions of the metallic feed material in the feed region and the substrate region can be achieved independently, within a single frame and/or across a plurality of frames (e.g., by way of a closed loop control operation) using a single beam electron beam source.

The teachings herein also contemplate software for performing the teachings. For example, suitable software may include a plurality of modules that interact with each other and process information for controlling the process and/or apparatus of the teachings. For example, the software may have (a) one or more modules that function to control feed rate of a metallic feed material in a substantially solid state into a feed region; (b) one or more modules that function to control emission of an electron beam having one or more predetermined electrical currents; (c) one or more modules that function to dynamically control rastering of the electron beam; (d) one or more modules that function to compare a signal obtained during monitoring of a condition of one or both of the feed region or the substrate region substantially in real time for the occurrence of any deviation from a predetermined condition and to identify any deviation from a known value (e.g., a value stored in a database with which the software interfaces). The one or more modules that function to compare a signal may interface with the one or more modules that function to dynamically control rastering of the electron beam (or any of the other modules) in order to dynamically alter processing conditions in accordance with the teachings herein. The software may be run on a suitable computer, and may include a module for interfacing with a user (e.g., a module that provides users with one or more graphical user interfaces, such as illustrated in FIGS. 4A and 4B), so that the user may control one or more of the operational parameters. For example, the software may be such that a user interface is provided that provides a visual depiction of operational settings or other user inputs (e.g., desired feed power or energy, substrate power or energy, beam current, point amounts, frame rate, clock rate, beam deflection and/or any other parameter shown in FIGS. 4A and 4B), or any and/or allows users to make modifications to any such setting.

Figure 5:
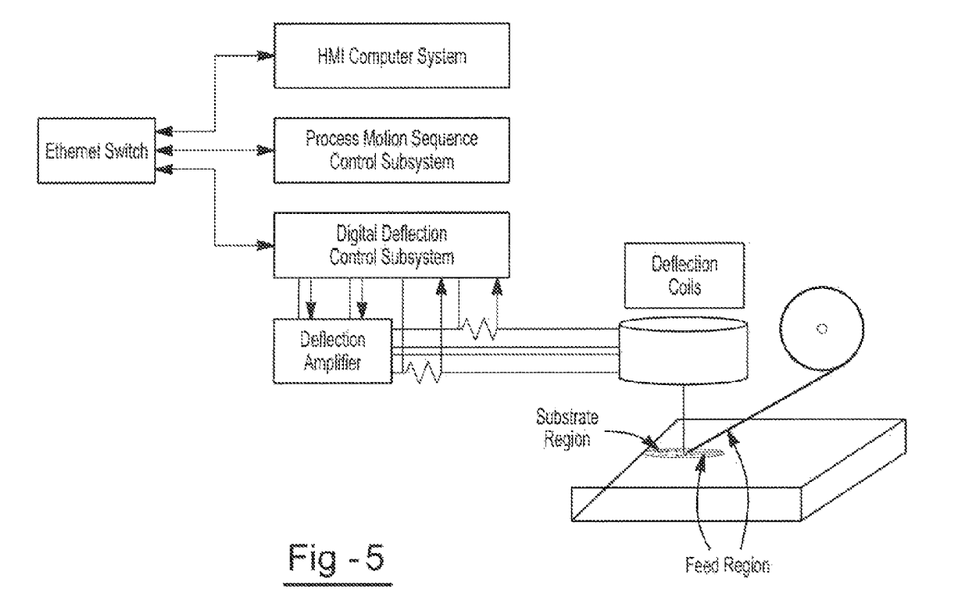
FIG. 5 is a schematic of a system in accordance with the teachings herein.

FIG. 5 illustrates an example of a system of hardware that may be employed for controlling operation of a deflector coil device. A plurality of subsystems may be in signaling communication with each other. For example, one or more Ethernet switches may interface with one or more subsystems. It may interface with a human machine interface (HMI) computer system. It may interface with one or more subsystem that controls processing parameters, machine motion (e.g., workpiece support, gun, feed delivery device). It may also interface with one or more subsystems that control the deflection of the beam. Such a system may include one or more suitable deflection amplifiers. Consistent with the teachings herein, it will be appreciated, that the functions of the subsystems may be performed by a single processor or spread out over a plurality of processors. As can be gleaned from the schematic, the deflection control subsystem may operate to set up an Ethernet communication transfer table with a process control subsystem to read reference values for all deflection parameters, AV and BC values, AV on/off flag and deflection mode. Coil feedback values may be read by the deflection control and written back to the process control across the network using data code writes. When in a dynamic raster operation, the pattern may be generated and output to the deflection amplifier. Whenever any of the dependant parameters change the pattern can be regenerated. Optionally, suitable buffering may be employed for assisting in data acquisition. For example, double buffering may be utilized to help provide glitch-free output of points contained in the pattern. For use herein in the control of the deflector coil, or other components, it is possible that one or more suitable data acquisition devices is employed. For example, it may be desirable to employ such as one having characteristics consistent with that available from National Instruments under the product designation NI 6368.

The present teachings also contemplate articles of manufacture made using the LM method, the LM apparatus, or both. The method of making the articles may result in a near net shape part that may be ready for finish machining. The article of manufacture may be an original equipment component, a replacement part, or a repaired original equipment component. The article may be heat-treated subsequent to its layer by layer manufacture. The article may be an aircraft component, a rocket component, a marine craft component, a railcar component, an automotive vehicle component, a chemical processing component, a turbine component, or a space vehicle component.

A substantially homogeneous microstructure may be obtained throughout at least about 50% (and more preferably at least about 80%) of a section thickness of the article. For example, a substantially homogeneous microstructure having a plurality of columnar grains may be obtained throughout at least about 50% (and more preferably at least about 80%) of a section thickness of the article. The article of manufacture may have an overall weight of at least about 10 kg, and may be made in a period of less than about 20 hours. For example, an article weighing about 60 to about 150 kg (or more) may be made in a period of no longer than about 20 hours. The article may exhibit a resulting substantially homogeneous microstructure, which is obtained throughout at least about 50% (and more preferably at least about 80%) of a section thickness of the article. For example, the article may be a substantially homogeneous microstructure having a plurality of columnar grains that is obtained throughout at least about 50% (and more preferably at least about 80%) of a section thickness of the article.

Relatively large articles (e.g., greater than 750 cm$^3$) may be metallic and may be made (e.g., the processes being completed) in a period of less than about 150 hours (e.g., less than about 100 hours, preferably less than about 50 hours, or even more preferably less than about 20 hours) for each article. The article may be prepared directly from computer-aided design data. The article may be prepared using a process, apparatus, or both that may be: free of a laser, prepared from a continuous deposition of each individual layer, prepared from an intermittent deposition of each individual layer, prepared in the absence of processing condition adjustment by a human during layer by layer buildup, or any combination thereof. It may be free of an ultrasonic detection method.

The process may be performed to fabricate an article at a rate of at least about 0.5, 1.0, 1.5, 2.5, 3.5, or even 4.0 cm$^3$/hr, or higher. The process may also be performed to fabricate an article at a rate of at least about 2.5, 3.0, 3.3, 5 or even 6.8 kg/hour. For example, it is possible that article (e.g., metallic article) build rates of at least about 0.5, 1.0, 1.5, 2.5, 3.5, or even 4.0 cm$^3$/hr. or higher, may be employed. It is also possible that, article (e.g., metallic article) build rates of at least about 2.5, 3.0, 3.3, 5, or even 6.8 kg/hour (e.g. having an average bead width of about 10 to about 15 mm) may be employed. The steps may be performed at a rate sufficient to deposit the raw material as a plurality of beads that define successive layers having an average bead width of about 10 to about 15 mm (e.g., about 12.7 mm) at a rate of at least about 25 cm of bead per minute (e.g., about 35 to 80 cm per minute or higher). The process may be interrupted for a period (e.g., of at least one minute, one hour, two hours, one day, or longer) prior to completion of the work piece, and may be resumed after complete solidification of the work piece occurs.

The teachings herein may employ other fabrication techniques, such as the use of a mold (e.g., as disclosed in U.S. Pat. No. 7,073,561 (incorporated by reference)), the use of a laser and/or electron beam gun (or other device that heats the metal) for cutting a layer after depositing the later (e.g., prior to depositing another layer, such as disclosed in U.S. Pat. No. 7,648,740 (incorporated by reference). To the extent not taught expressly here, or elsewhere herein, other art-disclosed operational parameters may be employed, such as are disclosed in U.S. Pat. No. 7,168,935, incorporated by reference (see, e.g., cols. 5, 9, and the claims). Other art disclosed energy emission devices may be employed alone or in combination with an electron beam gun, such as a laser.

It should be realized that a human operator may evaluate the overall operation of the energy emission device, the material delivery device, positioning mechanisms, vacuum operating parameters, or any combination thereof. Though an objective of the present invention is to form an automatic system, some aspects of the present invention may be used in a process that requires human intervention. The closed loop electronic control device may be configured to make the appropriate command inputs through the monitoring system and control software, or both, to manage the various systems of the layer manufacturing process. It is also possible to omit a closed loop control system, and to perform the teachings herein manually.

Structural relations, proportions, dimensions and geometries shown in the accompanying drawings are part of the teachings herein, even if not articulated verbally in the present detailed description. The teachings herein also contemplate variations to any relative proportions and dimensions shown in the drawings; e.g., variations within about ±10%, about ±25%, or even about ±50% are possible. Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. The specification of ranges herein also contemplates individual amounts falling within the range. Thus, for example, a range of 10 to 15 contemplates individually the amounts of 10, 11, 12, 13, 14, and 15.

The disclosures of all articles and references, including patent applications and publications, are incorporated by reference for all purposes. References to the phrase "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of, the elements, ingredients, components or steps.

Plural elements, Ingredients, components, or steps can be provided by a single integrated element, ingredient, component, or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. Likewise, any reference to "first" or "second" items is not intended to foreclose additional items (e.g., third, fourth, or more items); such additional items are also contemplated, unless otherwise stated. The teachings of the relative positions, orientations and proportions of components depicted in the accompanying drawings also form part of the teachings herein even if not expressly stated.

The above description is intended to be illustrative and not restrictive. Many embodiments as well as many applications besides the examples provided will be apparent to those of skill in the art upon reading the above description. It is further intended that any of the features of different aspects or embodiments of the invention may be combined. The scope of the invention should, therefore, be determined not with reference to the above description, but should instead be determined with reference to the appended claims, along with the full scope of equivalents to which such claims are entitled. The omission in the following claims of any aspect of subject matter that is disclosed herein is not a disclaimer of such subject matter, nor should it be regarded that the inventors did not consider such subject matter to be part of the disclosed inventive subject matter.

The invention claimed is:

1. A closed loop control method for layer-by-layer manufacturing of a three-dimensional metallic work piece, comprising the steps of:
   a) delivering a metallic feed material in a substantially solid state into a feed region, the metallic feed material being a transition metal or an alloy thereof;
   b) emitting an electron beam having one or more predetermined electrical currents by employing at least one electron beam gun;
   c) translating the electron beam through a first predetermined raster pattern frame in an x-y plane that includes:
      (i) a plurality of points within the feed region sufficient so that the metallic feed material is subjected to a melting beam power density level sufficient to cause melting of the metallic feed material and formation of a molten pool deposit; and
      (ii) a plurality of points in a substrate region that is outside of the feed region, sufficient so that the plurality of points outside the feed region is subjected to a substrate beam power density level that is different from the melting beam power density level;
   d) monitoring a condition of one or both of the feed region or the substrate region substantially in real time for the occurrence of any deviation from a predetermined condition, with such monitoring being performed by a detector including a camera, an electron phenomena detecting mechanism or a combination of both;
   e) upon detecting of any deviation, translating the electron beam through at least one second predetermined raster pattern frame in the x-y plane that maintains the melting beam power density level substantially the same as the first predetermined raster pattern frame, but alters the substrate beam power density level in a manner so that the monitored condition returns to the predetermined condition; and
   f) repeating steps (a) through (e) at one or more second locations for building up layer by layer, generally along a z-axis that is orthogonal to the x-y plane, a three-dimensional layered metallic work piece, wherein the metallic work piece is achieved by way of a closed loop control system.

2. The method of claim 1, wherein the step of delivering the metallic feed material includes advancing a metallic wire feed at a substantially constant feed rate, a variable feed rate, or both.

3. The method of claim 1, wherein at commencement of the method, the melting beam power density level in the feed region is substantially the same as the melting beam power density level in the substrate region.

4. The method of claim 1, wherein any translating of the electron beam includes deflecting the beam.

5. The method of claim 1, wherein the translating step includes a step of deflecting the beam with an electromagnetic coil.

6. The method of claim 1, wherein the translating step includes translating from point to point at a substantially constant clock rate and/or variable clock rate.

7. The method of claim 1, wherein throughout the steps (a)-(e) a substantially constant frame rate and/or variable frame rate is employed.

8. The method of claim 1, wherein throughout the steps (a)-(e) a substantially constant frame rate of at least about 1 kHz is employed, and a clock rate in excess of 1 MHz is employed.

9. The method of claim 8, wherein the molten pool deposit has a forward edge region in an x-y plane with a forward edge region width and a trailing edge region in the x-y plane with a trailing edge region width, and the step of monitoring the molten pool deposit monitors either or both of the forward edge region width or the trailing edge region width, and steps (a)-(e) are performed for maintaining a substantially constant molten pool deposit width at either or both of the forward edge region or the trailing edge region.

10. The method of claim 9, wherein the electron beam remains at a substantially constant focus throughout repetitions of steps (a)-(e).

11. The method of claim 1, wherein the steps of the method are carried out in an evacuated chamber.

12. The method of claim 11, wherein the feed region is supported on a workpiece support, and the workpiece support and the electron beam gun are translatable relative to each other.

13. The method of claim 1, wherein the metallic feed material includes titanium or an alloy of titanium.

14. The method of claim 13, wherein the metallic feed material includes an alloy of titanium, aluminum and optionally vanadium.

15. The method of claim 1, wherein the electron beam gun is controlled to achieve a frame by frame alteration of point densities for the feed region, the substrate region or both so that such single gun can supply varying amounts of heat to each of the feed region and the substrate region.

16. The method of claim 1, wherein such monitoring is performed by a detector including a camera.

17. A dosed loop control method for layer-by-layer manufacturing of a three-dimensional metallic work piece, comprising the steps of:
   a) delivering a metallic feed material in a substantially solid state into a feed region, the metallic feed material being a transition metal or an alloy thereof;
   b) emitting an electron beam having one or more predetermined electrical currents by employing at least one electron beam gun;
   c) translating the electron beam through a first predetermined raster pattern frame in an x-y plane that includes:
      (iii) a plurality of points within the feed region sufficient so that the metallic feed material is subjected to a melting beam power density level sufficient to cause melting of the metallic feed material and formation of a molten pool deposit; and
      (iv) a plurality of points in a substrate region that is outside of the feed region, sufficient so that the plurality of points outside the feed region is subjected to a substrate beam power density level that is different from the melting beam power density level;
   d) monitoring a condition of one or both of the feed region or the substrate region substantially in real time for the occurrence of any deviation from a predetermined condition, with such monitoring being performed by a detector including a camera, an electron phenomena detecting mechanism or a combination of both;
   e) upon detecting of any deviation, translating the electron beam through at least one second predetermined raster pattern frame in the x-y plane that maintains the melting beam power density level substantially the same as the first predetermined raster pattern frame, but alters the substrate beam power density level in a manner so that the monitored condition returns to the predetermined condition; and
   f) repeating steps (a) through (e) at one or more second locations for building up layer by layer, generally along a z-axis that is orthogonal to the x-y plane, a three-dimensional layered metallic work piece, wherein the metallic work piece is achieved by way of a closed loop control system.

18. An apparatus for performing the method of claim 17, wherein the apparatus includes the at least one electron beam gun, and a detector that includes a camera, an electron phenomena detecting mechanism, or a combination of both, and a deflector coil device.

19. A chased loop control method for layer-by-layer manufacturing of a three-dimensional metallic work piece, comprising the steps of:
   a) delivering a metallic feed material including titanium or an alloy of anium in a wire form in a substantially solid state into a feed region;
   b) emitting an electron beam having one or more predetermined electrical currents by employing a single electron beam gun;
   c) translating the electron beam through a first predetermined raster pattern frame in an x-y plane that includes:
      (v) a plurality of points within the feed region sufficient so that the metallic feed material is subjected to a melting beam power density level sufficient to cause melting of the metallic feed material and formation of a molten pool deposit; and
      (vi) a plurality of points in a substrate region that is outside of the feed region, sufficient so that the plurality of points outside the feed region is subjected to a substrate beam power density level that is different from the melting beam power density level;
   d) monitoring a condition of one or both of the feed region or the substrate region substantially in real time for the occurrence of any deviation from a predetermined condition, with such monitoring being performed by a detector including a camera, an electron phenomena detecting mechanism or a combination of both;
   e) upon detecting of any deviation, translating the electron beam through at least one second predetermined raster pattern frame in the x-y plane that maintains the melting beam power density level substantially the same as the first predetermined raster pattern frame, but alters the substrate beam power density level in a manner so that the monitored condition returns to the predetermined condition; and
   f) repeating steps (a) through (e) at one or more second locations for building up layer by layer, generally along a z-axis that is orthogonal to the x-y plane, a three-dimensional layered metallic work piece, wherein the metallic work piece is achieved by way of a closed loop control system.

20. The method of claim 19, wherein throughout the steps (a)-(e) a substantially constant frame rate of at least about 1 kHz is employed, and a clock rate in excess of 1 MHz is employed, and wherein the electron beam remains at a substantially constant focus throughout repetitions of steps (a)-(e).

* * * * *